(12) United States Patent
Chen

(10) Patent No.: US 9,564,520 B1
(45) Date of Patent: Feb. 7, 2017

(54) METHOD OF FORMING SEMICONDUCTOR DEVICE

(71) Applicant: United Microelectronics Corp., Hsinchu (TW)

(72) Inventor: Tzu-Ping Chen, Hsinchu County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 15/199,684

(22) Filed: Jun. 30, 2016

(51) Int. Cl.
*H01L 29/66* (2006.01)
*H01L 27/115* (2006.01)
*H01L 21/311* (2006.01)

(52) U.S. Cl.
CPC .... *H01L 29/66833* (2013.01); *H01L 21/31111* (2013.01); *H01L 21/31116* (2013.01); *H01L 21/31144* (2013.01); *H01L 27/1157* (2013.01)

(58) Field of Classification Search
USPC ........................................................ 438/287
See application file for complete search history.

(56) References Cited

U.S. PATENT DOCUMENTS

| 2002/0016081 A1* | 2/2002 | Aloni | H01L 21/31116 438/714 |
| 2002/0020890 A1* | 2/2002 | Willer | H01L 27/115 257/390 |
| 2005/0186741 A1* | 8/2005 | Roizin | H01L 27/105 438/275 |

* cited by examiner

*Primary Examiner* — Zandra Smith
*Assistant Examiner* — Lawrence Tynes, Jr.
(74) *Attorney, Agent, or Firm* — J.C. Patents

(57) ABSTRACT

A method of forming a semiconductor device is disclosed. A sacrificial oxide layer is formed on a substrate having first and second areas. Using a photoresist mask exposing the first area and covering the second area as a mask layer, by a wet etching process, the sacrificial oxide layer in the first area and an edge portion of the sacrificial oxide layer in the second area are simultaneously removed, wherein the sacrificial oxide layer remained in the second area has a sidewall with a slope smaller than 40 degrees. An oxide-nitride-oxide (ONO) layer is formed over the first and second areas. The sacrificial oxide layer and the ONO layer formed thereon in the second area are removed, so that the ONO layer remained in the first area forms a first gate insulating layer in the first area. A second gate insulating layer is formed in the second area.

14 Claims, 4 Drawing Sheets

METHOD OF FORMING SEMICONDUCTOR DEVICE

BACKGROUND OF THE INVENTION

Field of the Invention

The invention relates to an integrated circuit fabrication, and particularly relates to a method of forming a semiconductor device.

Description of Related Art

Generally, a memory device includes a select gate and a control gate, and an oxide-nitride-oxide (ONO) layer serves as a control gate insulating layer and also serves as a charge storage layer for memory and an oxide layer serves as a select gate insulating layer. In the conventional method of forming the control gate insulating layer, a sacrificial oxide layer is formed over a substrate including a select gate area and a control gate area, and then by using a hard mask layer exposing the control gate area and covering the select gate area, the sacrificial oxide layer in the control gate area is removed. Thereafter, an ONO layer is formed in the select gate area and the control gate area, and the ONO layer and the hard mask layer therebeneath in the select gate area are removed. Accordingly, the remained ONO layer in the control gate area forms the gate insulating layer for the control gate to be formed.

However, when using a silicon nitride layer as the hard mask layer, the ONO layer and the hard mask layer therebeneath at the boundary of the select gate area and the control gate area are difficult to remove completely since the ONO layer has a steep sidewall. As a result, as shown in FIG. 1, the ONO residue R is remained between the select gate SG and the control gate CG. Furthermore, when performing an implantation process on the substrate by using the select gate and the control gate as a mask, a good implant profile is hard to achieve due to the masking defect of the ONO residue, and the electronic performance of the device may be effected.

SUMMARY OF THE INVENTION

Accordingly, the present invention provides a method of forming a semiconductor device, in which a photoresist mask is adopted as a mask layer to form the sacrificial oxide layer having a sidewall with a slope smaller than 40 degrees in the second area, so as to eliminate the formation of the ONO residues at the boundary of the first and second areas and improve the device of the performance.

The present invention provides a method of forming a semiconductor device. A substrate having a first area and a second area is provided. A sacrificial oxide layer is formed on the substrate in the first and second areas. A photoresist mask is formed on the sacrificial oxide layer to expose the first area and cover the second area. Using the photoresist mask as a mask layer, by a wet etching process, the sacrificial oxide layer in the first area and an edge portion of the sacrificial oxide layer in the second area covered by the photoresist mask are simultaneously removed, wherein the sacrificial oxide layer remained in the second area has a sidewall with a slope smaller than 40 degrees. An oxide-nitride-oxide (ONO) layer is formed over the substrate in the first and second areas. The sacrificial oxide layer and the ONO layer formed thereon in the second area are removed, so that the ONO layer remained in the first area forms a first gate insulating layer on the substrate in the first area. A second gate insulating layer is formed on the substrate in the second area.

According to an embodiment of the present invention, the edge portion of the sacrificial oxide layer in the second area removed by the wet etching process is disposed adjacent to a boundary of the first and second areas.

According to an embodiment of the present invention, the step of removing the sacrificial oxide layer in the first area and the edge portion of the sacrificial oxide layer in the second area further includes using a dry etching process.

According to an embodiment of the present invention, the sacrificial oxide layer and the ONO layer formed thereon in the second area are simultaneously removed.

According to an embodiment of the present invention, the method further includes forming first and second gates respectively on the first and second gate insulating layers.

According to an embodiment of the present invention, the method further includes performing an implantation process on the substrate by using the first and second gates as a mask.

According to an embodiment of the present invention, the method further includes forming first and second spacers respectively on sidewalls of the first and second gates.

According to an embodiment of the present invention, the method further includes performing an implantation process on the substrate by using the first and second gates and the first and second spacers as a mask.

According to an embodiment of the present invention, the wet etching process is performed by using a buffered oxide etchant (BOE), and the buffered oxide etchant (BOE) is a solution of $HF/NH_4F$ in a ratio of 20:1 to 100:1 mixed with water.

According to an embodiment of the present invention, the wet etching process is performed for about 35 to 45 seconds.

According to an embodiment of the present invention, a thickness of the sacrificial oxide layer remained in the second area after performing the wet etching process is about 20 to 200 angstroms.

According to an embodiment of the present invention, the second gate insulating layer includes an oxide layer.

According to an embodiment of the present invention, the sidewall of the sacrificial oxide layer remained in the second area has a smooth surface.

According to an embodiment of the present invention, the first area is a control gate area and the second area is a select gate area.

In view of the above, in the present invention, the photoresist mask is used as a mask layer to remove the sacrificial oxide layer in the first area and the edge portion of the sacrificial oxide layer in the second area, and the sacrificial oxide layer remained in the second area has a sidewall with a gentle slope. Therefore, after the ONO layer forms on the sacrificial oxide layer remained in the second area, the ONO layer and the sacrificial oxide layer therebeneath may be removed easily. In other words, with the method of the invention, the formation of the ONO residues at the boundary of the first and second areas is eliminated, and the performance of the device is accordingly improved.

Several exemplary embodiments accompanied with figures are described in detail below to further describe the present invention in details.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
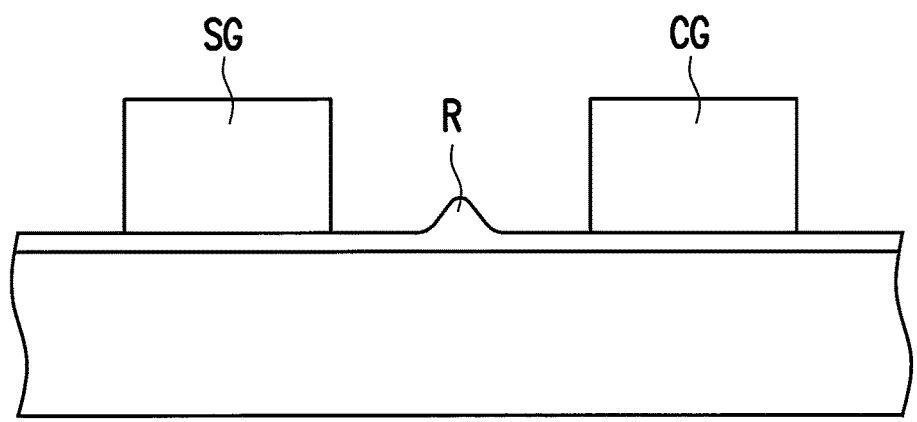
FIG. 1 illustrates an ONO residue remained between a select gate and a control gate in a conventional semiconductor device.

Reference will now be made in detail to the present preferred embodiments of the invention, examples of which are illustrated in the accompanying drawings. Wherever possible, the same reference numbers are used in the drawings and the description to refer to the same or like parts.

FIG. 2A to FIG. 2F are schematic cross-sectional views illustrating a method of forming a semiconductor device according to an embodiment of the invention.

Figure 2A:
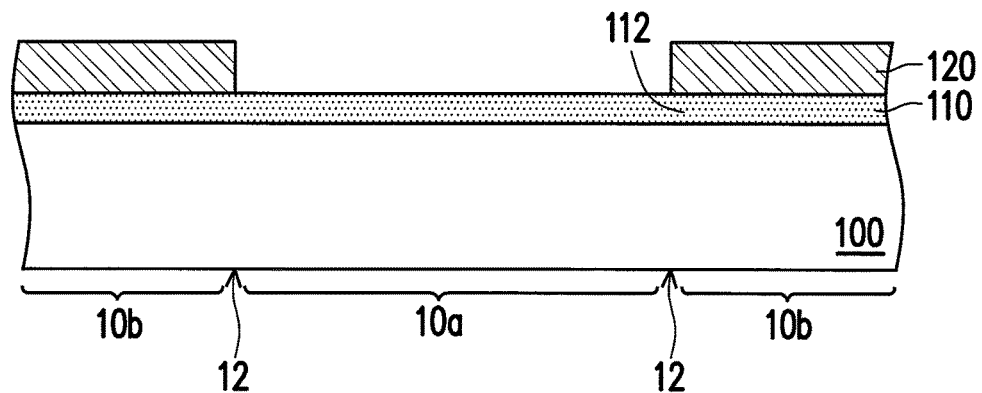
FIG. 2A to FIG. 2F are schematic cross-sectional views illustrating a method of forming a semiconductor device according to an embodiment of the present invention.

Referring to FIG. 2A, a substrate 100 is provided. The substrate 100 can be a semiconductor substrate, such as a silicon-containing substrate. The substrate 100 has at least one first area 10a and at least one second area 10b. In an embodiment, the substrate 100 includes a cell area and a periphery area (not shown), and the at least one first area 10a and the at least one second area 10b are disposed in the cell area. In an embodiment, the at least one first area 10a and the at least one second area 10b are alternatively arranged and form a memory device area. In an embodiment, the first area 10a is a control gate area, and the second area 10b is a select gate area, but the present invention is not limited thereto. In an embodiment, a boundary 12 is formed between the first area 10a and the second area 10b.

Then, a sacrificial oxide layer 110 is formed on the substrate 100 in the first and second areas 10a and 10b. In an embodiment, the sacrificial oxide layer 110 includes silicon oxide, and the forming method thereof includes performing a thermal oxidation process or a suitable deposition process such as chemical vapor deposition (CVD). A thickness of the sacrificial oxide layer 110 ranges from 100 to 200 angstroms.

After that, a photoresist mask 120 is formed on the sacrificial oxide layer 110 to expose the first area 10a and cover the second area 10b. In an embodiment, the photoresist mask 120 is formed through a photolithography process with a photomask.

Figure 2B:
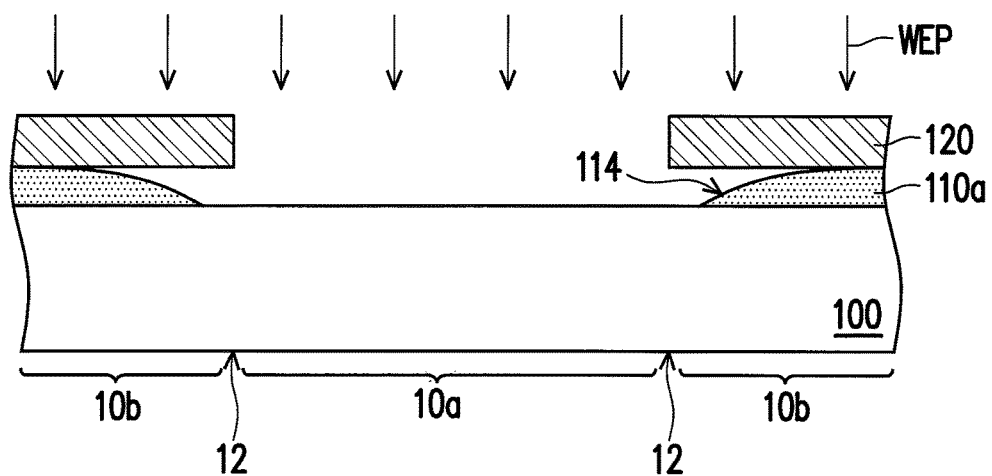

Referring to FIGS. 2A and 2B, using the photoresist mask 120 as a mask layer, by a wet etching process WEP, the sacrificial oxide layer 110 in the first area 10a and an edge portion 112 of the sacrificial oxide layer 110 in the second area 10b covered by the photoresist mask 120 are simultaneously removed. In an embodiment, the edge portion 112 of the sacrificial oxide layer 110 in the second area 10b is disposed adjacent to the boundary 12 of the first and second areas 10a and 10b. In detail, although the edge portion 112 of the sacrificial oxide layer 110 in the second area 10b is covered by the photoresist mask 120, the edge portion 112 is also removed by the wet etching process WEP due to the lateral etching of the wet etching process WEP to the photoresist mask 120. In other words, the wet etching process WEP not only etches the sacrificial oxide layer 110 in the first area 10a not shielded by the photoresist mask 120, but also etches the edge portion 112 of the sacrificial oxide layer 110 in the second area 10b shielded by the photoresist mask 120 but proximate to the boundary 12. In an embodiment, the wet etching process WEP is performed by using a buffered oxide etchant (BOE), and the buffered oxide etchant (BOE) is a solution of $HF/NH_4F$ in a ratio of 20:1 to 100:1 mixed with water. In an embodiment, the wet etching process WEP is performed for about 35 to 45 seconds. In an embodiment, a dry etching process is performed with the wet etching process WEP to remove the sacrificial oxide layer 110 in the first area 10a and the edge portion 112 of the sacrificial oxide layer 110 in the second area 10b. In other words, the sacrificial oxide layer 110 is removed by using a combination of a wet etching process and a dry etching process.

After performing the wet etching process WEP, the sacrificial oxide layer 110a remained in the second area 10b has a sidewall 114 with a slope smaller than 40 degrees. In another embodiment, the slope is smaller than 30 degrees. In yet another embodiment, the slope is smaller than 20 degrees. In an embodiment, after performing the wet etching process WEP, a thickness of the sacrificial oxide layer 110a is about 20 to 200 angstroms. In an embodiment, the sidewall 114 of the sacrificial oxide layer 110a has a smooth surface. In an embodiment, the sidewall 114 and the top portion (not shown) of the sacrificial oxide layer 110a substantially form a smooth profile such as a saturation curve-like profile.

Figure 2C:
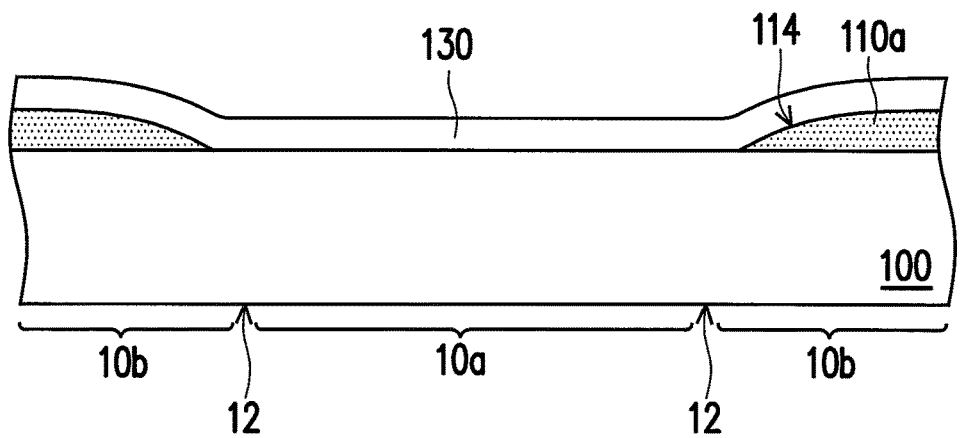

Referring to FIG. 2C, an oxide-nitride-oxide (ONO) layer 130 is formed over the substrate 100 in the first and second areas 10a and 10b. In an embodiment, the ONO layer 130 is formed on the substrate 100 in the first area 10a and the sacrificial oxide layer 110a in the second area 10b, wherein the ONO layer 130 is conformally formed over the sidewall 114 of the sacrificial oxide layer 110a. The forming method of the ONO layer 130 includes performing a suitable deposition process such as chemical vapor deposition (CVD) or atomic layer deposition (ALD). In an embodiment, a thickness of the ONO layer 130 ranges from 100 to 200 angstroms.

Figure 2D:
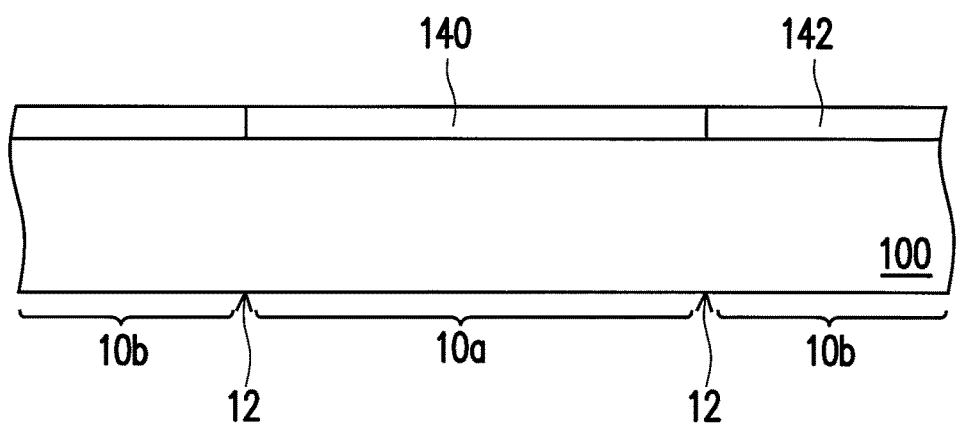

Referring to FIG. 2D, the sacrificial oxide layer 110a and the ONO layer 130 formed thereon in the second area 10b are removed, so that the ONO layer 130 remained in the first area 10a forms a first gate insulating layer 140. In an embodiment, the sacrificial oxide layer 110a and the ONO layer 130 formed thereon in the second area 10b are simultaneously removed by an etching process. In an embodiment, the etching process is a wet etching process, a dry etching process or a combination thereof. In an embodiment, the wet etching process uses a buffered oxide etchant (BOE), and the buffered oxide etchant (BOE) is a solution of $HF/NH_4F$ in a ratio of 20:1 to 100:1 mixed with water.

After removing the sacrificial oxide layer 110a and the ONO layer 130 thereon in the second area 10b, a second gate insulating material layer 142 is formed in the second area 10b. In an embodiment, the second gate insulating material layer 142 includes an oxide layer such as a silicon oxide layer, and the forming method thereof includes performing a thermal oxidation process or a suitable deposition process such as chemical vapor deposition (CVD) or atomic layer deposition (ALD). In an embodiment, a thickness of the second gate insulating layer 142 ranges from 50 to 150 angstroms.

Figure 2E:
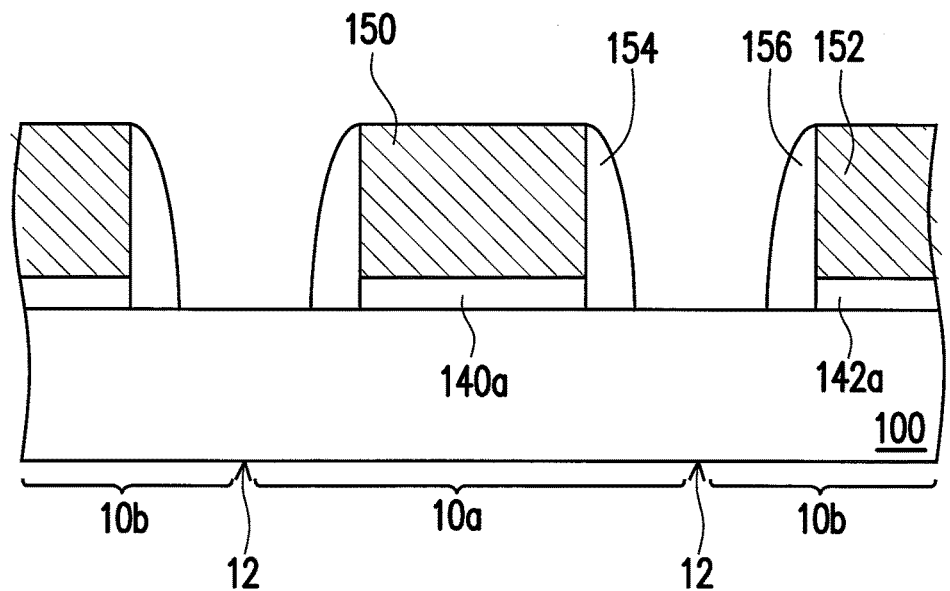

Referring to FIG. 2E, first and second gates 150 and 152 are respectively formed in the first and second areas 10a and 10b, and the first and second gate insulating layers 140a and 142a respectively beneath the first and second gates 150 and 152 are formed. In an embodiment, the first gate insulating layer 140a serves as a tunnel insulating layer, and the first gate 150 serves as a control gate. Besides, the second gate insulating layer 142a serves as a select gate insulating layer, and the second gate 152 serves as a select gate. Each of the first and second gates 150 and 152 includes a silicon-containing material such as amorphous silicon, polysilicon or a combination thereof, and forming method thereof includes performing a deposition process (e.g., CVD) and a patterning process.

In an embodiment, first and second spacers 154 and 156 are respectively formed on sidewalls of the first and second gates 150 and 152. Each of the first and second spacers 154 and 156 includes SiN, SiCN or a combination thereof, and forming method thereof includes forming a spacer material layer (not shown) on the substrate 100, and performing an anisotropic etching process to remove a portion of the spacer material layer.

In an embodiment, after the first and second gates 150 and 152 are respectively formed over the first and second gate insulating layers 140 and 142, a spacer material layer is formed over the first and second gates 150 and 152 and the first and second gate insulating layers 140 and 142, and then the spacer material layer and the first and second gate insulating layers 140 and 142 are simultaneously patterned to form the first and second spacers 154 and 156 and the first and second gate insulating layers 140a and 142a. However, forming methods and orders of the first and second gate insulating layers 140a and 142a, the first and second gates 150 and 152 and the first and second spacers 154 and 156 are illustrated and are not construed as limiting the invention.

In addition, the embodiment of FIG. 2E in which each of the gates and the spacers is illustrated as a single layer is provided for illustration purposes and is not construed as limiting the invention. It is appreciated by people having ordinary skill in the art that each of the said elements can be a composite layer or a multi-layer structure upon the process requirements. Moreover, in another embodiment, a floating gate may be disposed on the first gate with an inter-gate dielectric layer therebetween.

Figure 2F:
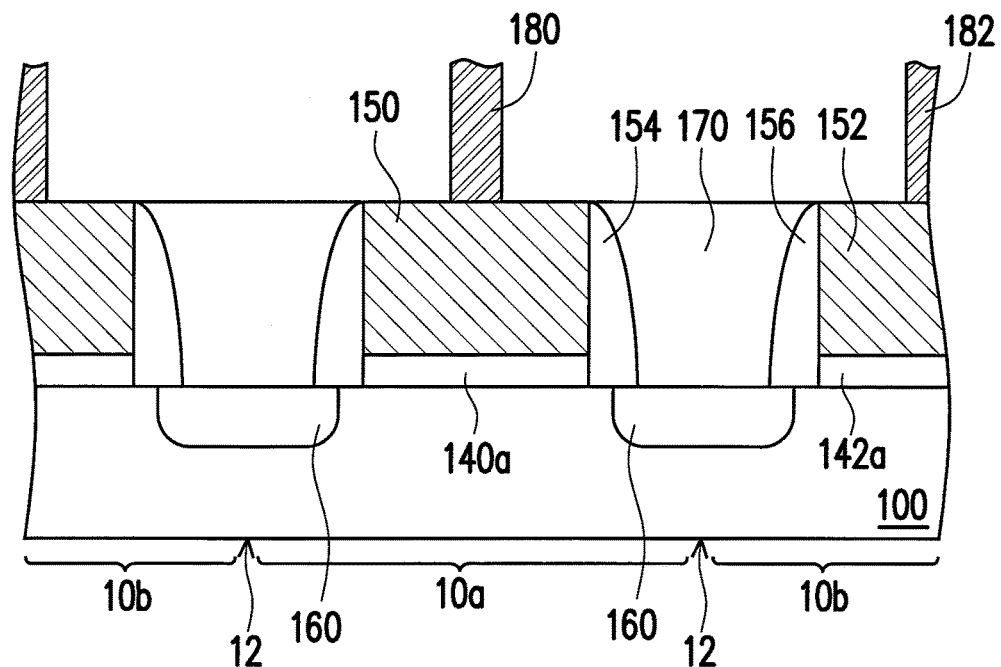

Referring to FIG. 2F, a plurality of doped regions 160 is formed in the substrate 100 besides the first gate 150 and the second gate 152. In an embodiment, the method of forming the doped regions 160 includes performing an ion implantation process by using the first and second gates 150, 152 and the first and second spacers 154, 156 as a mask. In another embodiment, the method of forming the doped regions 160 includes performing an ion implantation process by using the first and second gates 150, 152 as a mask if the first and second spacers 154, 156 are not formed. In an embodiment, the first gate 150 and the second gate 152 share one of the doped regions 160. Additionally, two doped regions (not shown) are located at outer sides of the first gate 150 and the second gate 152.

Then, an inter-layer dielectric layer 170 is formed is formed around the first and second gates 150 and 152. The inter-layer dielectric layer 170 includes silicon oxide, borophosphosilicate glass (BPSG), phosphosilicate glass (PSG), undoped silicate glass (USG), fluorosilicate glass (FSG), spin-on glass (SOG), a low-dielectric-constant (low-k) material having a dielectric constant of lower than about 4 or a combination thereof. The method of forming the inter-layer dielectric layer 170 includes performing a spin coating process or a suitable deposition process such as CVD. In an embodiment, an etch stop layer (not shown) can be formed between the inter-layer dielectric layer 170 and each of the first and second spacers 154 and 156 and between the inter-layer dielectric layer 170 and the substrate 100.

Thereafter, conductive plugs 180, 182 are formed to electrically connect to the first gate 150 and the second gate 152, respectively. The fabrication of the semiconductor structure of the invention is thus completed. It is noted the fabrication of the semiconductor structure of the invention focuses on the cell area, and the fabrication of the elements in the periphery area is omitted since it is known to known to persons skilled in the art.

In the conventional method, since the sacrificial oxide layer formed by using a silicon nitride as a hard mask has a steep sidewall, the sacrificial oxide layer and the ONO layer formed thereon are hard to remove completely, and the ONO residues are remained between the gates. Furthermore, when forming the doped regions by using the gates as a mask, a good implant profile is hard to achieve due to the masking defect of the ONO residues. However, in the present invention, since the sacrificial oxide layer 110 in the first area 10a is removed by using the photoresist layer 120 as a mask layer, an edge portion 112 of the sacrificial oxide layer 110 in the second area 10b covered by the photoresist mask 120 is simultaneously removed. Therefore, the remained sacrificial oxide layer 110a in the second area 10b has a sidewall 114 with a gentle slope smaller than 40 degrees, and the sacrificial oxide layer 110a and the ONO layer 130 formed thereon may be removed easily. Therefore, the formation of the ONO residues at the boundary 12 of the first and second areas 10a and 10b is eliminated. Accordingly, the profile of the doped regions formed by an implantation process and using the first and second gates 150 and 152 as the mask is good, and the performance of the device is improved.

In summary, in the present invention, by using the photoresist mask as a mask layer to cover the second area and expose the first area, the sacrificial oxide layer in the first area is removed by the wet etching process. Due to a combination of the photoresist mask and the wet etching process, the edge portion of the sacrificial oxide layer in the second area covered by the photoresist mask is also removed, and the remained sacrificial oxide layer in the second area is formed with a sidewall having a gentle slope. Therefore, the remained sacrificial oxide layer and the ONO layer formed thereon can be removed easily. In other words, the formation of the ONO residues at the boundary of the first and second areas is eliminated. Accordingly, the profile of the doped regions formed by an implantation process and using the first and second gates as the mask is good and not effected by the ONO residues, and the performance of the device is improved. Additionally, the method of forming a semiconductor device has simplified steps, and does not increase the cost.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:
1. A method of forming a semiconductor device, comprising:
  providing a substrate having a first area and a second area;
  forming a sacrificial oxide layer on the substrate in the first and second areas;
  forming a photoresist mask on the sacrificial oxide layer to expose the first area and cover the second area;
  using the photoresist mask as a mask layer, by a wet etching process, simultaneously removing the sacrificial oxide layer in the first area and an edge portion of the sacrificial oxide layer in the second area covered by the photoresist mask, wherein the sacrificial oxide layer remained in the second area has a sidewall with a slope smaller than 40 degrees;

forming an oxide-nitride-oxide (ONO) layer over the substrate in the first and second areas;

removing the sacrificial oxide layer and the ONO layer formed thereon in the second area, so that the ONO layer remained in the first area forms a first gate insulating layer on the substrate in the first area; and forming a second gate insulating layer on the substrate in the second area.

2. The method of claim 1, wherein the edge portion of the sacrificial oxide layer in the second area removed by the wet etching process is disposed adjacent to a boundary of the first and second areas.

3. The method of claim 1, wherein the step of removing the sacrificial oxide layer in the first area and the edge portion of the sacrificial oxide layer in the second area further comprises using a dry etching process.

4. The method of claim 1, wherein the sacrificial oxide layer and the ONO layer formed thereon in the second area are simultaneously removed.

5. The method of claim 1, further comprising forming first and second gates respectively on the first and second gate insulating layers.

6. The method of claim 5, further comprising performing an implantation process on the substrate by using the first and second gates as a mask.

7. The method of claim 5, further comprising forming first and second spacers respectively on sidewalls of the first and second gates.

8. The method of claim 7, further comprising performing an implantation process on the substrate by using the first and second gates and the first and second spacers as a mask.

9. The method of claim 1, wherein the wet etching process is performed by using a buffered oxide etchant (BOE), and the buffered oxide etchant (BOE) is a solution of HF/NH$_4$F in a ratio of 20:1 to 100:1 mixed with water.

10. The method of claim 1, wherein the wet etching process is performed for about 35 to 45 seconds.

11. The method of claim 1, wherein a thickness of the sacrificial oxide layer remained in the second area after performing the wet etching process is about 20 to 200 angstroms.

12. The method of claim 1, wherein the second gate insulating layer comprises an oxide layer.

13. The method of claim 1, wherein the sidewall of the sacrificial oxide layer remained in the second area has a smooth surface.

14. The method of claim 1, wherein the first area is a control gate area and the second area is a select gate area.

* * * * *